(12) United States Patent
Liu et al.

(10) Patent No.: US 10,505,020 B2
(45) Date of Patent: Dec. 10, 2019

(54) FINFET LDMOS DEVICES WITH IMPROVED RELIABILITY

(71) Applicant: AVAGO TECHNOLOGIES INTERNATIONAL SALES PTE. LIMITED

(72) Inventors: Qing Liu, Irvine, CA (US); Akira Ito, Irvine, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

(21) Appl. No.: 15/725,722

(22) Filed: Oct. 5, 2017

(65) Prior Publication Data

US 2018/0108755 A1 Apr. 19, 2018

Related U.S. Application Data (60) Provisional application No. 62/407,588, filed on Oct. 13, 2016.

(51) Int. Cl.
| | |
|---|---|
| *H01L 29/66* | (2006.01) |
| *H01L 29/78* | (2006.01) |
| *H01L 21/4763* | (2006.01) |
| *H01L 29/06* | (2006.01) |
| *H01L 29/08* | (2006.01) |

(52) U.S. Cl.
CPC .. *H01L 29/66681* (2013.01); *H01L 21/47635* (2013.01); *H01L 29/0611* (2013.01); *H01L 29/0619* (2013.01); *H01L 29/0642* (2013.01); *H01L 29/0653* (2013.01); *H01L 29/0878* (2013.01); *H01L 29/0886* (2013.01); *H01L 29/66795* (2013.01); *H01L 29/7816* (2013.01); *H01L 29/7825* (2013.01); *H01L 29/7835* (2013.01); *H01L 29/7851* (2013.01)

(58) Field of Classification Search
CPC ... H01L 29/78; H01L 29/66; H01L 29/66681; H01L 29/7816; H01L 29/7825; H01L 29/7835; H01L 29/7851
USPC ........................................................ 257/355
See application file for complete search history.

(56) References Cited

U.S. PATENT DOCUMENTS

| | | | | |
|---|---|---|---|---|
| 9,379,237 | B1 * | 6/2016 | Chang | H01L 29/0653 |
| 9,478,542 | B1 * | 10/2016 | Ito | H01L 27/0886 |
| 9,741,793 | B2 * | 8/2017 | Parris | H01L 29/66659 |
| 2006/0138549 | A1 * | 6/2006 | Ko | H01L 21/823412 |
| | | | | 257/368 |

(Continued)

*Primary Examiner* — Fazli Erdem
(74) *Attorney, Agent, or Firm* — Xsensus LLP (57) ABSTRACT

A finFET LDMOS semiconductor device includes a first well disposed adjacent to a second well on a substrate and a third well disposed on the substrate, wherein the second well is disposed between the first well and the third well. Additionally, the finFET LDMOS semiconductor device includes a source disposed on the first well, a fin at least partially disposed on the first well and adjacent to the source, a drain disposed on the third well, a shallow trench isolation (STI) disposed at least partially in the third well, and a STI protection structure disposed on the substrate between the second well and the third well and along a side of the STI that is closest to the source, wherein the STI protection structure is configured to discourage a drain to source current from flowing along the side of the STI that is closest to the source.

19 Claims, 12 Drawing Sheets

(56) References Cited

U.S. PATENT DOCUMENTS

| | | | |
|---|---|---|---|
| 2008/0246080 A1* | 10/2008 | Ito | H01L 29/0865 257/328 |
| 2008/0251863 A1* | 10/2008 | Huang | H01L 27/0207 257/409 |
| 2009/0224335 A1* | 9/2009 | Chang | H01L 29/4238 257/396 |
| 2010/0109080 A1* | 5/2010 | Huang | H01L 29/0847 257/335 |
| 2011/0169077 A1* | 7/2011 | Ito | H01L 29/0653 257/336 |
| 2012/0199878 A1* | 8/2012 | Shrivastava | H01L 29/0653 257/192 |
| 2013/0056808 A1* | 3/2013 | Tai | H01L 27/1463 257/292 |
| 2014/0027849 A1* | 1/2014 | Yang | H01L 29/402 257/343 |
| 2014/0167173 A1* | 6/2014 | Ito | H01L 29/66659 257/368 |
| 2014/0327074 A1* | 11/2014 | Tsao | H01L 27/0886 257/337 |
| 2014/0346596 A1* | 11/2014 | Ellis-Monaghan | H01L 29/66681 257/335 |
| 2014/0346597 A1* | 11/2014 | Feilchenfeld | H01L 29/7816 257/339 |
| 2015/0014768 A1* | 1/2015 | Chen | H01L 29/7816 257/339 |
| 2015/0076610 A1* | 3/2015 | Ito | H01L 29/785 257/365 |
| 2015/0340428 A1* | 11/2015 | Lu | H01L 29/063 257/337 |
| 2016/0111488 A1* | 4/2016 | Lu | H01L 29/7825 257/330 |
| 2016/0181358 A1* | 6/2016 | Zhang | H01L 29/66689 257/339 |
| 2016/0240663 A1* | 8/2016 | Tu | H01L 29/0653 |
| 2016/0372360 A1* | 12/2016 | Fang | H01L 21/76229 |
| 2017/0194320 A1* | 7/2017 | Chen | H01L 27/088 |
| 2017/0194487 A1* | 7/2017 | Chen | H01L 29/7816 |
| 2018/0122942 A1* | 5/2018 | Ponoth | H01L 29/7835 |
| 2018/0308841 A1* | 10/2018 | Liu | H01L 27/0886 |

* cited by examiner

FINFET LDMOS DEVICES WITH IMPROVED RELIABILITY

TECHNICAL FIELD

The present disclosure relates generally to integrated circuits, and more particularly, but not exclusively, to a lateral double-diffused MOS (LDMOS) device and structure for fin field-effect transistor (finFET) technology.

BACKGROUND

There are a number of challenges that scaling of conventional planar metal-oxide-semiconductor field-effect transistors (MOSFETs) are faced with. For example, threshold swing degradation, large drain-induced barrier lowering (DIBL), device characteristics fluctuations, and leakage are among the most common problems that may be addressed by 3-D device structures. Fin field-effect transistors (Fin-FETs) are 3-D device structures that can be used in nanoscale complementary metal-oxide-semiconductor (CMOS) and high-density memory applications. FinFETs with lateral double-diffused MOS (LDMOS) structures, which are mostly used in RF power amplifiers, can provide a high breakdown voltage between drain and source terminals). The high breakdown voltage is achieved, for example, by a charge carrier (e.g., electron) flow path that passes through a depletion region.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

In an exemplary implementation, a laterally double-diffused MOS (LDMOS) finFET device includes a first well disposed adjacent to a second well on a substrate and a third well disposed on the substrate, wherein the second well is disposed between the first well and the third well. Additionally, the finFET LDMOS semiconductor device includes a source disposed on the first well, a fin at least partially disposed on the first well and adjacent to the source, a drain disposed on the third well, a shallow trench isolation (STI) disposed at least partially in the third well, and a STI protection structure disposed on the substrate between the second well and the third well and along a side of the STI that is closest to the source, wherein the STI protection structure is configured to discourage a drain to source current from flowing along the side of the STI that is closest to the source.

Aspects of the present disclosure are directed to improving reliability of fin field-effect transistor (finFET) lateral double-diffused MOS (LDMOS) devices, which are increasingly used in high voltage applications. However, the presence of defect-rich zones along fin edges and shallow trench isolation (STI) can cause degradation of the devices when stressed for long periods of time. The implementations described further herein provide ways to direct current passing through the finFET LDMOS devices (hereinafter "LDMOS devices") away from the defect-rich zones in order to improve the reliability of the devices. The implementations described herein can be applied to 16 nm and 7 nm FinFET LDMOS designs.

Figure 1A:
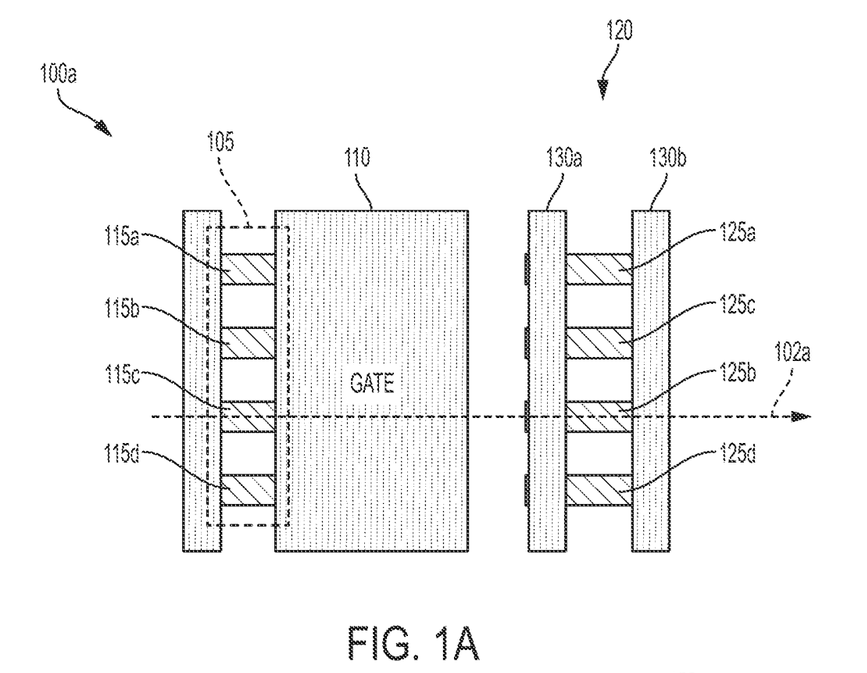
FIG. 1A illustrates a top view of a lateral double-diffused MOS (LDMOS) finFET device according to one or more aspects of the disclosed subject matter.
Figure 1B:
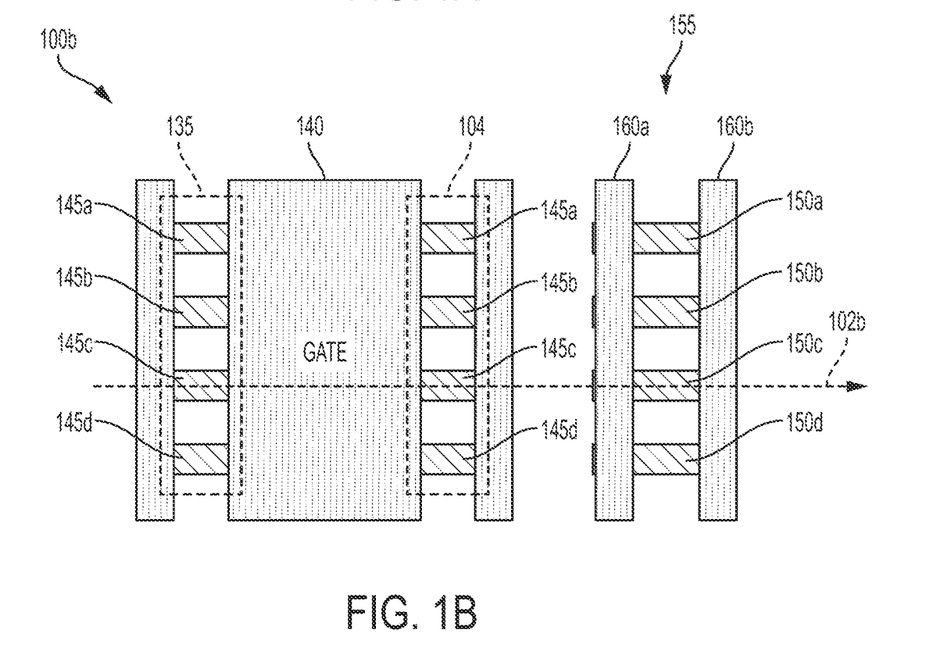
FIG. 1B illustrates a top view of a lateral double-diffused MOS (LDMOS) finFET device with a pseudo-drain according to one or more aspects of the disclosed subject matter.
Figure 8:
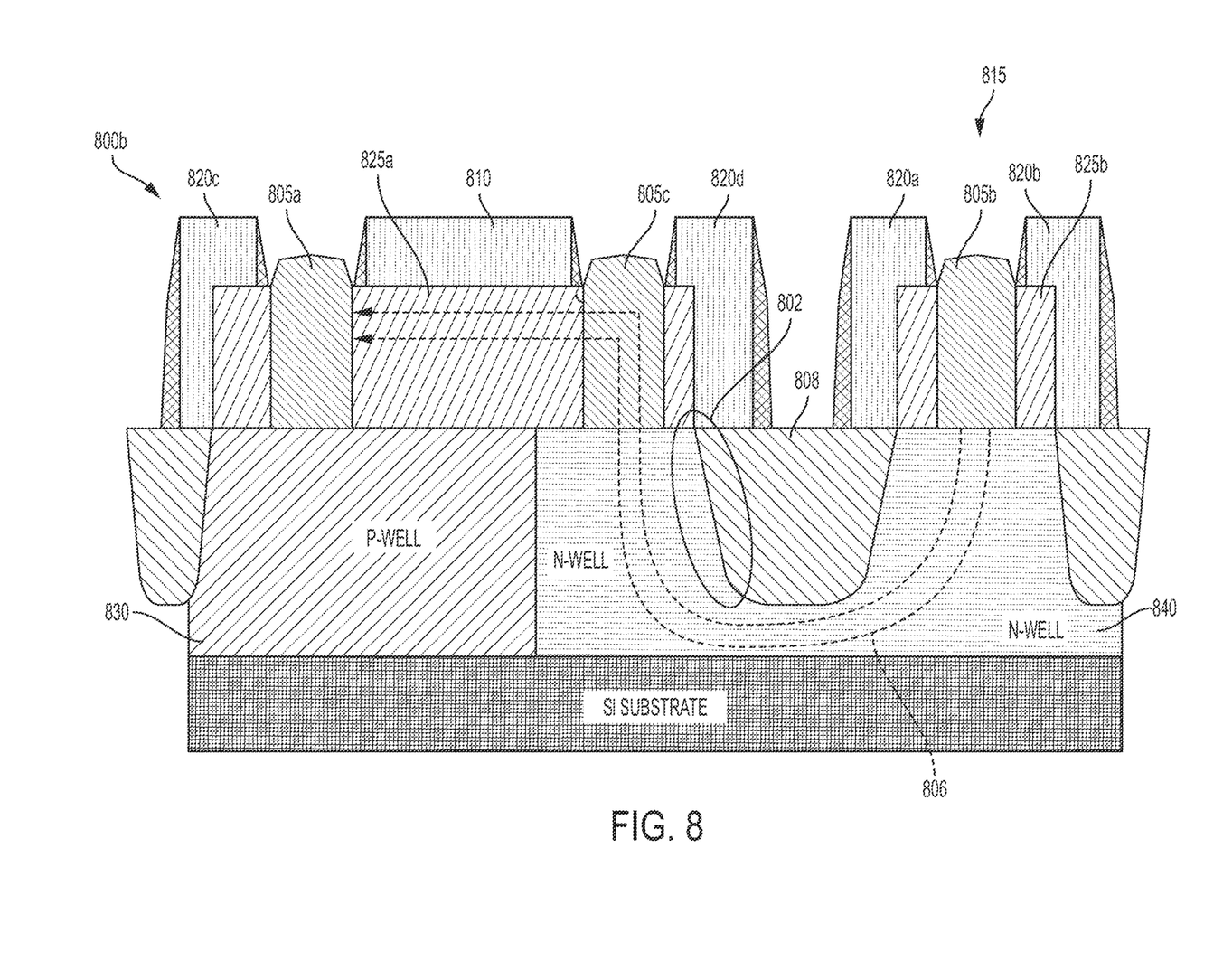
FIG. 8 illustrates a cross-sectional view of a second structure of a LDMOS fin FET device according to one or more aspects of the disclosed subject matter.
Figure 9:
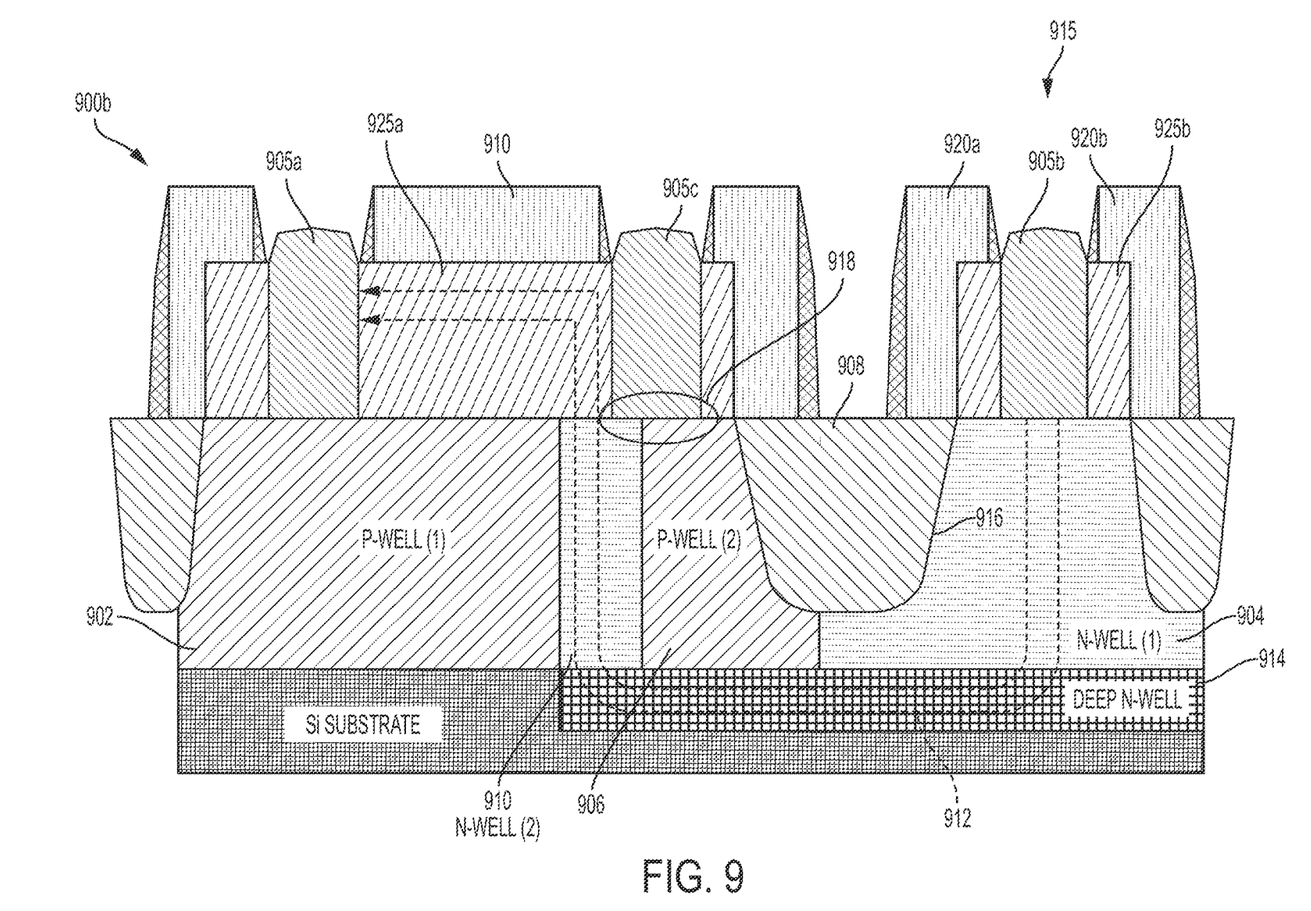
FIG. 9 illustrates a cross-sectional view of a second structure of a LDMOS fin FET device according to one or more aspects of the disclosed subject matter.
Figure 10:
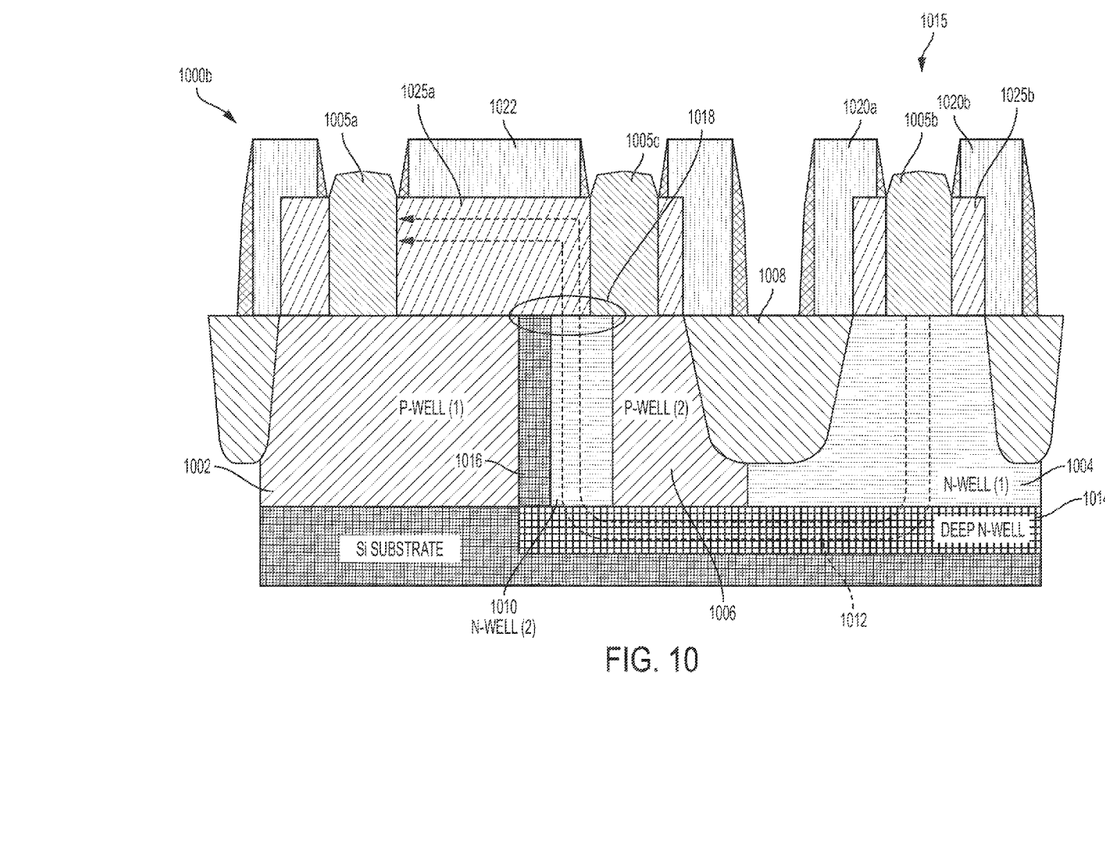
FIG. 10 illustrates a cross-sectional view of a second structure of a LDMOS fin FET device according to one or more aspects of the disclosed subject matter.

FIGS. 1A and 1B illustrate top views of LDMOS devices 100a and 100b. As shown in FIG. 1A, LDMOS device 100a includes a source structure 105 and a gate structure 110 disposed on a first set of fins 115a-115d and a drain structure 120 disposed on a second set of fins 125a-125d separated from the first set of fins 115a-115d by a predetermined distance. Additionally, the drain structure 120 can include spacers 130a and 130b. FIGS. 2-7 illustrate cross-sectional views of the LDMOS device 100a taken at reference axis 102a. As shown in FIG. 1B, LDMOS device 100b includes a source structure 135 and a gate structure 140 as well as a pseudo-drain structure 104 disposed on a first set of fins 145a-145d and a drain structure 155 disposed on a second set of fins 150a-150d separated from the first set of fins 145a-145d by a predetermined distance. Additionally, the drain structure 155 can include spacers 160a and 160b. FIGS. 8-10 illustrate cross-sectional views of the LDMOS device 100b taken at reference axis 102b. A footprint of the LDMOS device 100a has an area that is 10% smaller than a footprint of the LDMOS device 100b.

Figure 2:
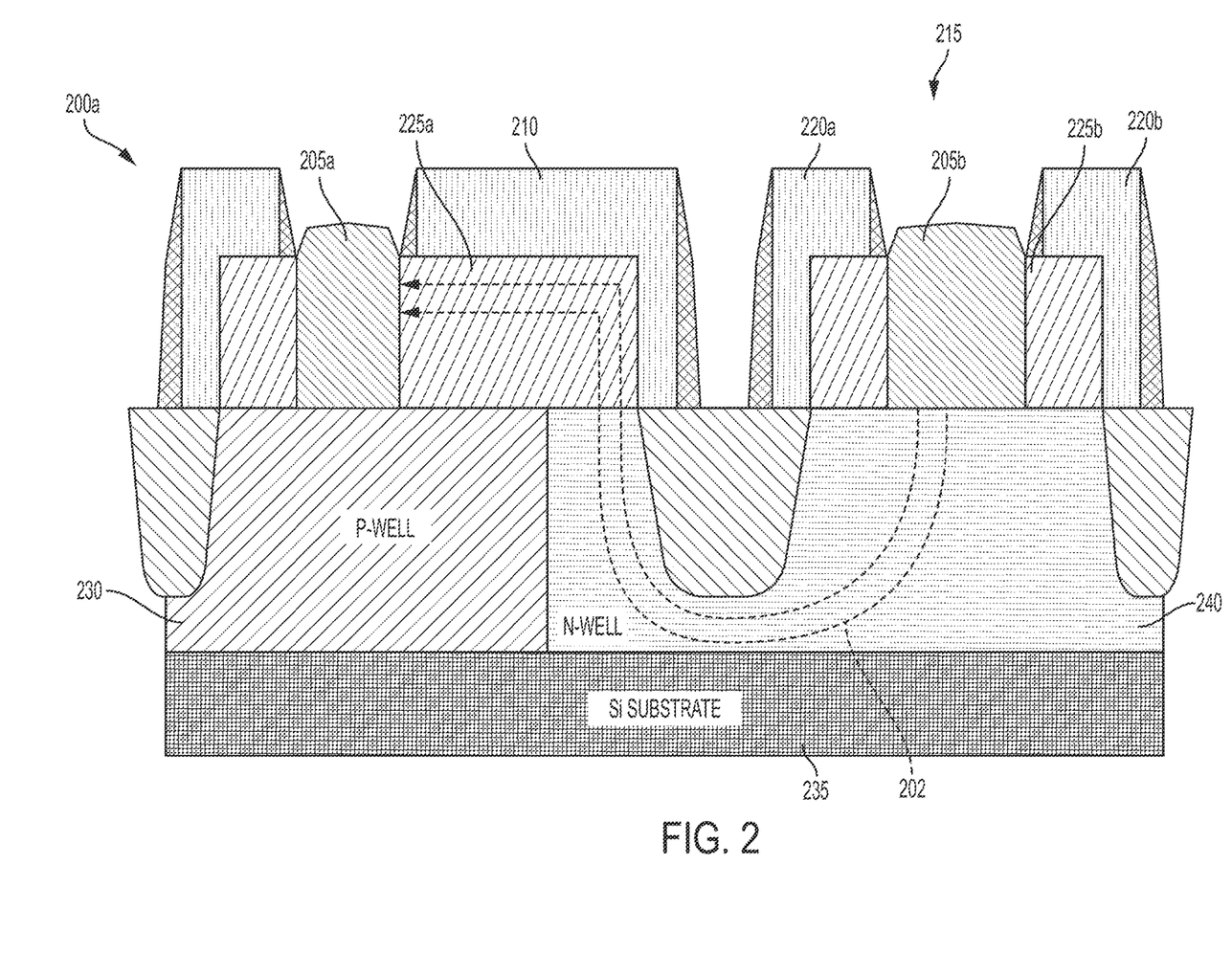
FIG. 2 illustrates a cross-sectional view of a first structure of a LDMOS finFET device according to one or more aspects of the disclosed subject matter.

The cross-sectional view shown in FIG. 2 illustrates LDMOS device 200a, which is an implementation of the LDMOS device 100a. The LDMOS device 200a has in-situ epitaxial (EPI) doped fins 205a and 205b as a source and drain, respectively, of the device 200a and a gate structure 210 that surrounds the first set of fins, wherein the first set of fits includes a doped portion 205a and an undoped portion 225a. The LDMOS device 200a also includes spacers 220a and 220b as part of the drain structure 215 that surround the drain 205b on the second set of fins, wherein the second set of fins includes the doped portion 205b and an undoped portion 225b. A total height of the fins that are connected to a silicon (Si) substrate is approximately 100-150 nanometers (nm) with approximately 30-50 nm exposed above a p-well and n-well. In addition, the STIs of the LDMOS device 200a are shallower than in conventional LDMOS devices. For example, the STIs of the LDMOS device are approximately 50-100 nm in length while the STIs of conventional LDMOS devices are approximately 200-250 nm in length. In order to support high voltage applications, a breakdown voltage of the LDMOS device 200a has to provide a current path from the drain 215 to the gate 210 and further to the source (e.g., 205a as part of source structure 105) along a STI edge 206 to a fin edge 208 that is long enough to reduce the voltage to a level that is supported by the gate 210. For example, a voltage at the drain may be 3-5 volts while a rated voltage for the gate 210 may be 1.8V. The shorter length of the STIs in the LDMOS device 200a shortens current path from the drain 215 to the gate 210 and source 205a (e.g., where 205a can be part of source structure 105), which can make supporting high voltage applications more challenging. For example, a current 202 can flow from the drain 215 through an N-well 240 and through the undoped fin portion 225a. The LDMOS device 200a can also include a P-well 230 and an Si substrate 235 to assist in directing the flow of the current 202. It should be appreciated that a well can be created in a layer formed through ion implantation or through deposition, for example. Alternatively, or additionally, the terms well or layer can sometimes be used interchangeably.

Figure 3:
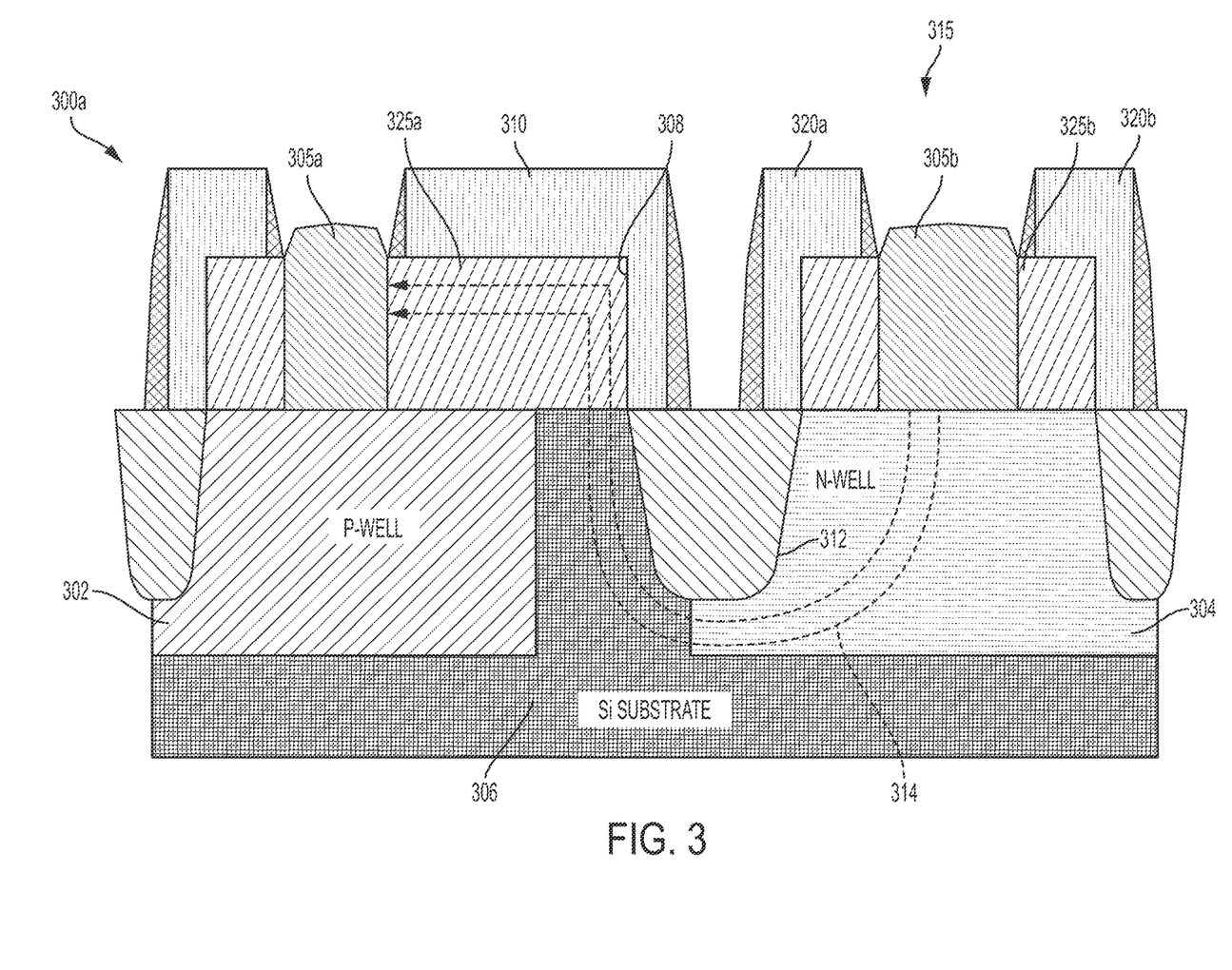
FIG. 3 illustrates a cross-sectional view of a first structure of a LDMOS finFET device according to one or more aspects of the disclosed subject matter.

The cross-sectional view shown in FIG. 3 illustrates LDMOS device 300a, which is an implementation of the LDMOS device 100a. The LDMOS device 300a has a similar structure to the LDMOS 200a (FIG. 2) except for P-well 302 is pulled back to become underlapped so that an undoped region of Si substrate 306 is between the P-well 302 and N-well 304, which increases the breakdown voltage of the LDMOS device 300a. For example, the current 314 can flow through the N-well 304 along an STI edge 312, through the undoped region 306 of the Si Substrate between the P-well 302 and the N-well 304, and through the undoped fin portion 325a along a fin edge 308. The LDMOS device 300a similarly includes an in-situ EPI doped fin 305a as the source, wherein the fin can include the doped portion 305a and an undoped portion 325a, an a drain structure 315 including in-situ EPI doped fin 305b as a drain surrounded by spacers 320a and 320b, wherein the fin includes the doped portion 305b and an undoped portion 325b, and a gate 310.

Figure 4:
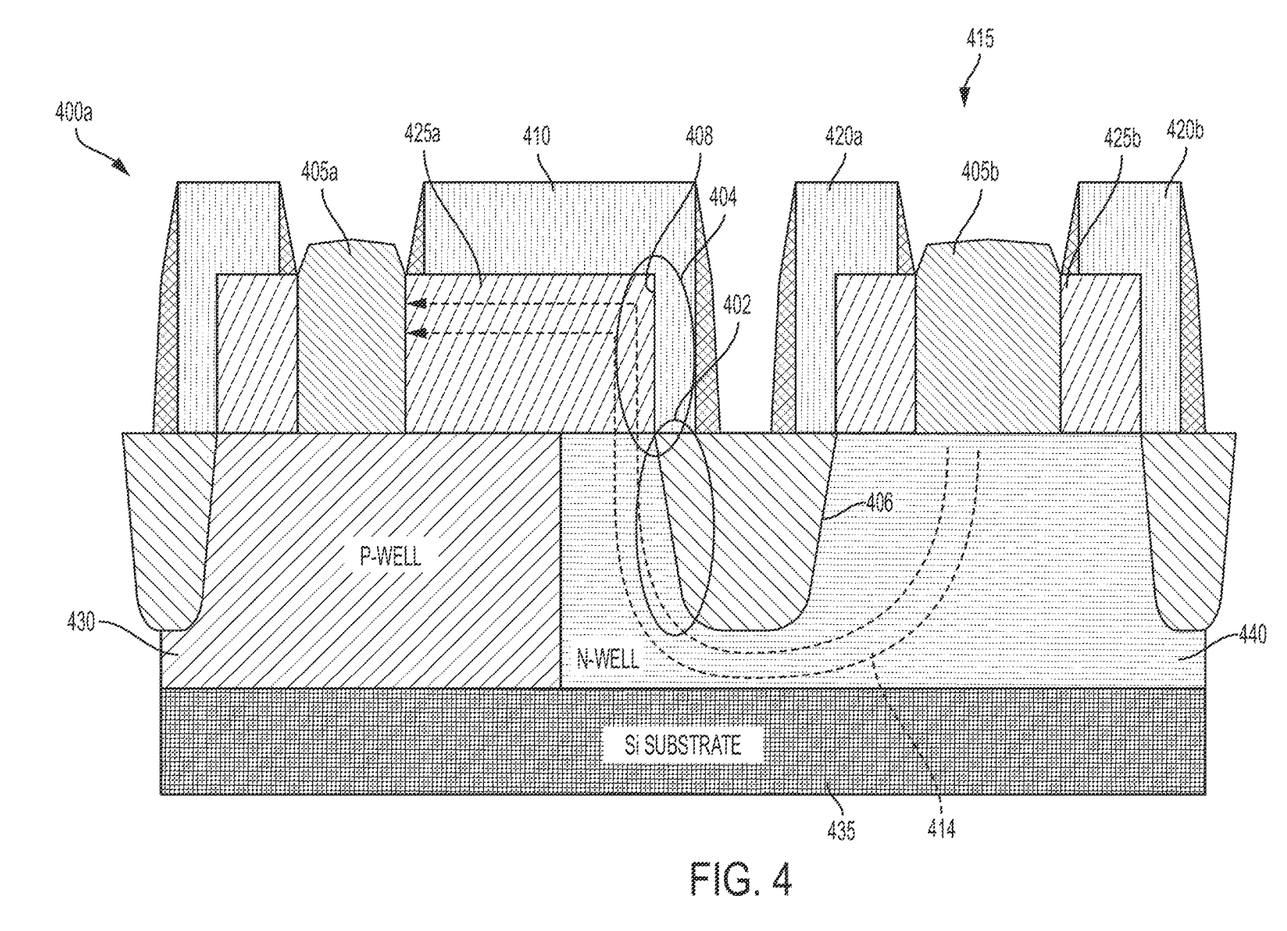
FIG. 4 illustrates a cross-sectional view of a first structure of a LDMOS finFET device according to one or more aspects of the disclosed subject matter.

The cross-sectional view shown in FIG. 4 illustrates LDMOS device 400a, which is an implementation of the LDMOS device 100a. The LDMOS device 400a has a similar structure to the LDMOS 200a (FIG. 2) and shows a first defect-rich zone 402 along a STI edge 406 and a second defect-rich zone 404 along a fin edge 408 at a gate 410 of the LDMOS device 400a. In some implementations, defects are formed during manufacturing at the defect-rich zones 402 and 404, which can be exacerbated when stresses occur at the LDMOS device 400a. Current 414 flowing from a drain structure 415 to the gate 410 and source (e.g., 405a) of the LDMOS device 400a travels a path along the STI edge 406 and fin edge 408, coming close to the defect-rich zones 402 and 404, which can lead to stresses and eventual failure of the LDMOS device 400a. The LDMOS device 400a similarly includes the in-situ EPI doped fin 405a as the source, wherein the fin can include the doped portion 405a and an undoped portion 425a, an a drain structure 415 including in-situ EPI doped fin 405b as a drain surrounded by spacers 420a and 420b, wherein the fin includes the doped portion 405b and an undoped portion 425b, a gate 410, and an SI substrate 435.

Figure 5:
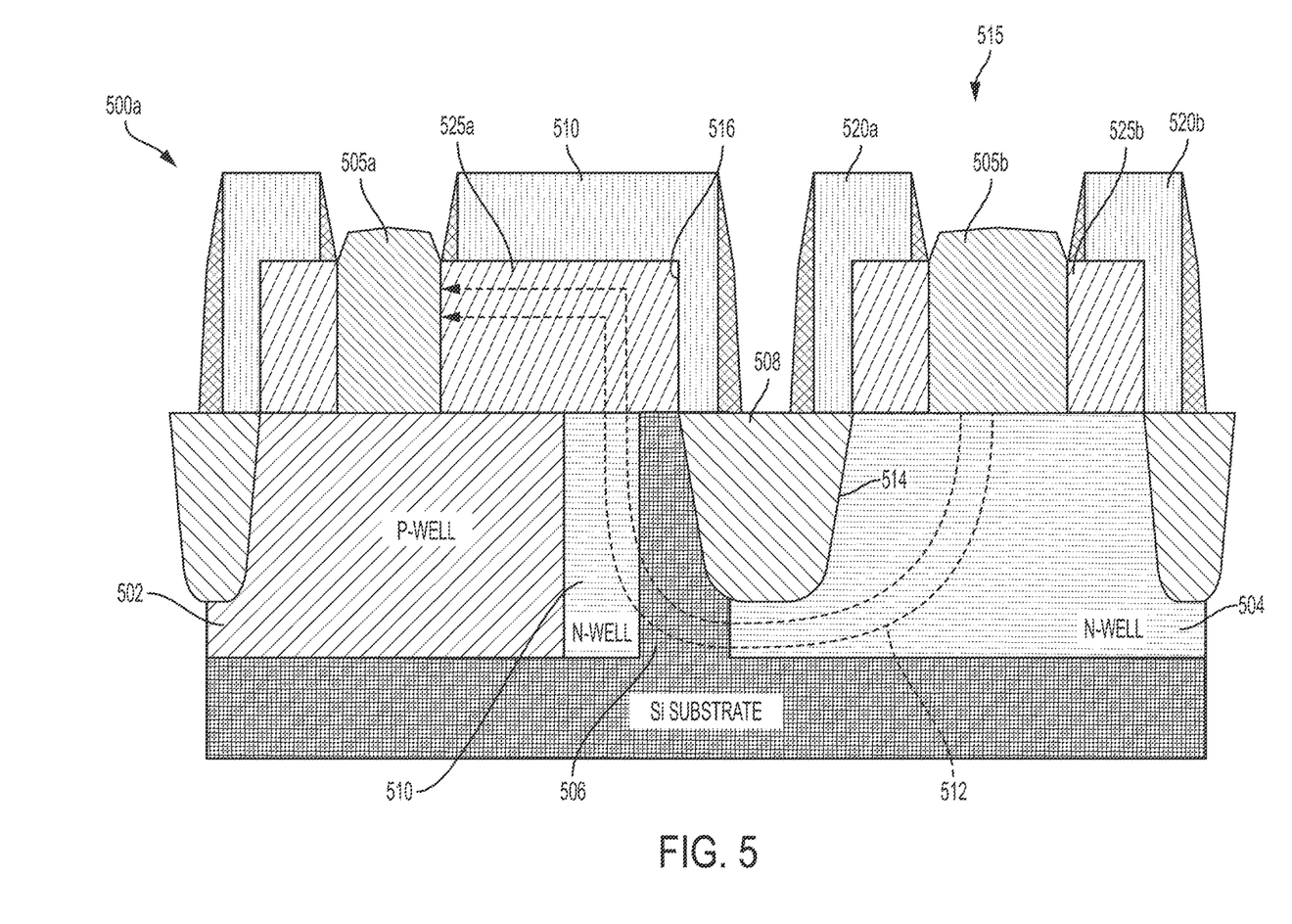
FIG. 5 illustrates a cross-sectional view of a first structure of a LDMOS finFET device according to one or more aspects of the disclosed subject matter.

The cross-sectional view shown in FIG. 5 illustrates LDMOS device 500a, which is an implementation of the LDMOS device 100a. The LDMOS device 500a has a similar structure to the LDMOS 300a (FIG. 3) where P-well 502 is pulled back from N-well 504 to become underlapped so that an STI protection structure 506 is in contact with STI 508 and an additional N-well 510 is between the undoped region 506 and the P-well 502. The STI protection structure 606 can be an undoped portion of the Si substrate, for example. The additional N-well 510 produces a low-resistance path for current 512 flowing from the drain 505b to the gate 510 and further to the source 505a of the LDMOS device, which draws the current 512 away from the STI-edge 514 and fin edge 516 defect-rich zones and provides a longer current path between the drain 505b and the gate 510, which increases the breakdown voltage of the LDMOS device 500a. The LDMOS device 500a similarly includes the in-situ EPI doped fin 505a as the source, wherein the fin can include the doped portion 505a and an undoped portion 525a, and a drain structure 515 including EPI doped fin 505b as the drain surrounded by spacers 520a and 520b, wherein the fin includes the doped portion 505b and an undoped portion 525b.

Figure 6:
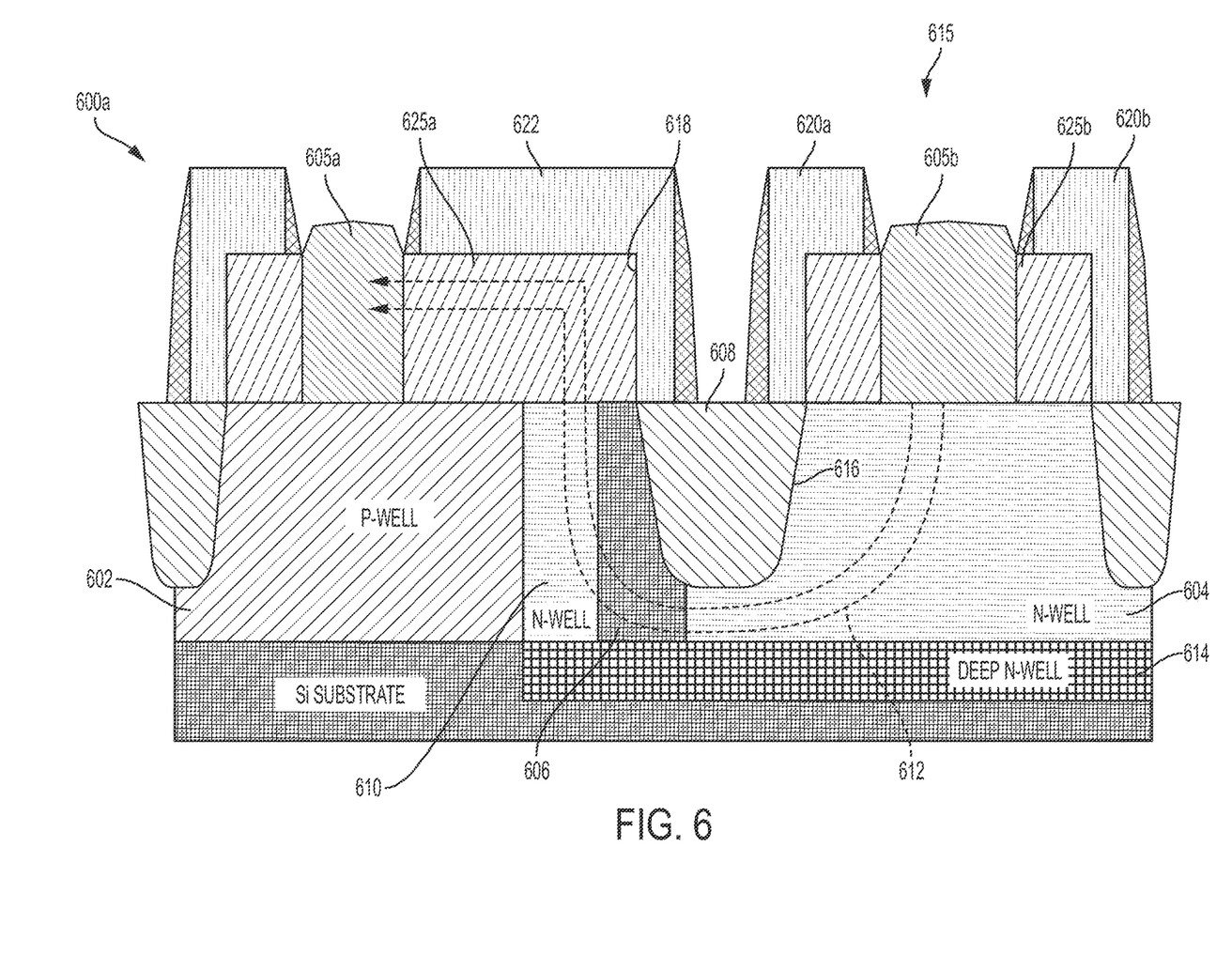
FIG. 6 illustrates a cross-sectional view of a first structure of a LDMOS finFET device according to one or more aspects of the disclosed subject matter.

The cross-sectional view shown in FIG. 6 illustrates LDMOS device 600a, which is an implementation of the LDMOS device 100a. The LDMOS device 600a has a similar structure to the LDMOS 500a (FIG. 5) where P-well 602 is pulled back from N-well 604 to become underlapped so that an STI protection structure 606 is in contact with STI 608 and an additional N-well 610 is between the STI protection structure 606 and the P-well 602. The STI protection structure 606 can be an undoped region of the Si substrate, for example. The LDMOS device 600a also includes a deep N-well 614 beneath N-wells 604 and 610 and the STI protection structure 606. In an embodiment, the deep N-well 614 can also be extended beneath P-well 602. The deep N-well 614 is less doped than the N-wells 604 and 610 but more highly doped than the STI protection structure 606, as well as the Si substrate in general, which further draws current 612 away from the STI edge 616 and fin edge 618 defect-rich zones and also provides a longer current path between a drain 605b and the gate 622, increasing the breakdown voltage of the LDMOS device 600a. The LDMOS device 600a similarly includes an in-situ EPI doped fin 605a as the source, wherein the fin can include the doped portion 605*a* and an undoped portion 625*a*, and a drain structure 615 including in-situ EPI doped fin 605*b* as the drain surrounded by spacers 620*a* and 620*b*, wherein the fin includes the doped portion 605*b* and an undoped portion 625*b*.

Figure 7:
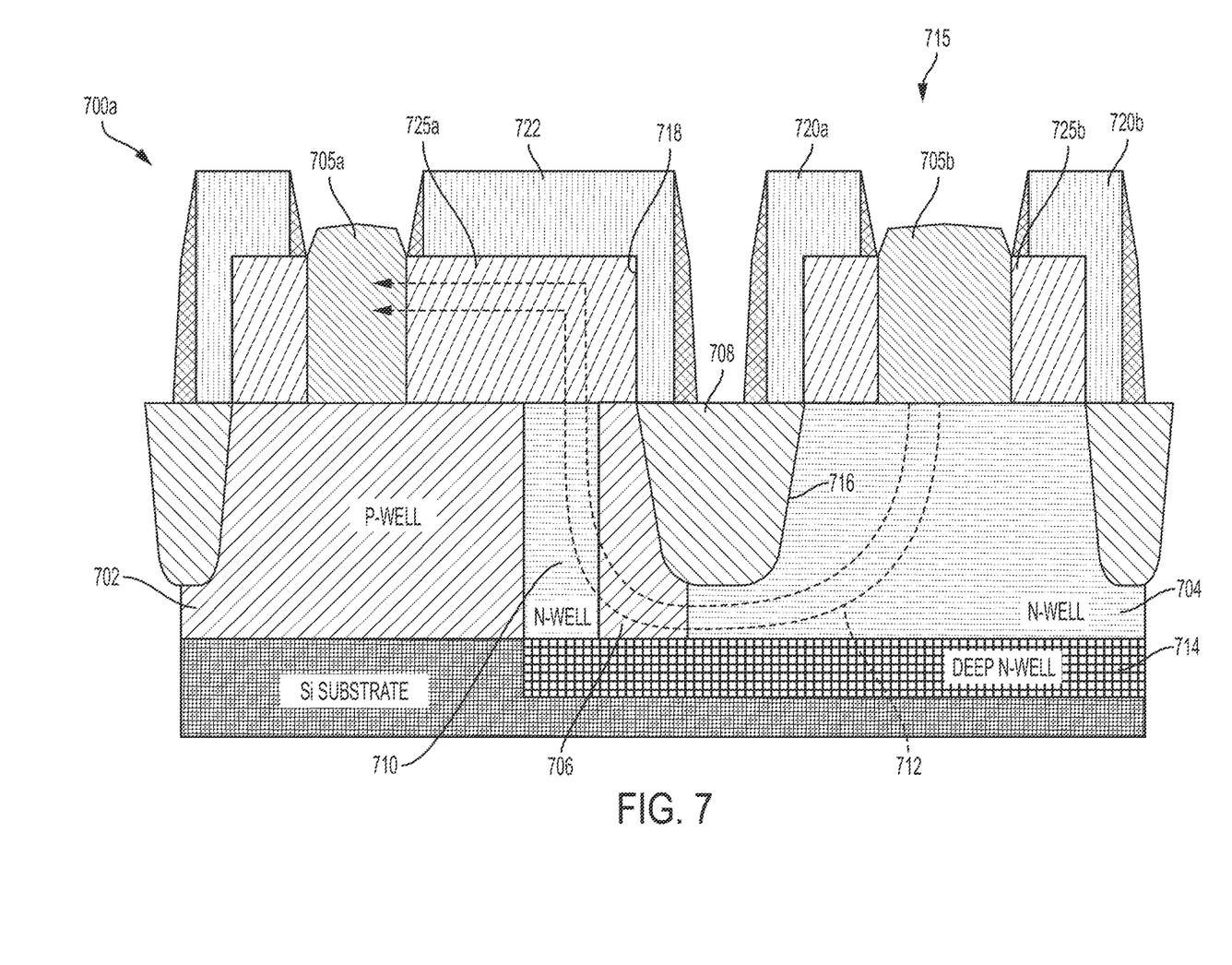
FIG. 7 illustrates a cross-sectional view of a first structure of a LDMOS finFET device according to one or more aspects of the disclosed subject matter.

The cross-sectional view shown in FIG. 7 illustrates LDMOS device 700*a*, which is an implementation of the LDMOS device 100*a*. The LDMOS device 700*a* has a similar structure to the LDMOS 600*a* (FIG. 6) where P-well 702 is pulled back from N-well 704 to become underlapped so that an STI protection structure 706 is in contact with STI 708 and an additional N-well 710 is between the STI protection structure 706 and the P-well 702. The STI protection structure 706 can be an additional P-well, for example. The LDMOS device 700*a* also includes a deep N-well 714 beneath N-wells 704 and 710 and the additional P-well 706, which can also be extended beneath the P-well 702. The additional P-well 706 produces a reverse-biased P-N junction, which blocks current 712 from entering the additional P-well 706, which further draws the current 712 away from the STI edge 716 and fin edge 718 defect-rich zones and also provides a longer current path between a drain 705*b* and the gate 722, increasing the breakdown voltage of the LDMOS device 700*a*. The LDMOS device 600*a* similarly includes an in-situ EPI doped fin 705*a* as the source, wherein the fin can include the doped portion 705*a* and an undoped portion 725*a*, and a drain structure 715 including in-situ EPI doped fin 705*b* as the drain surrounded by spacers 720*a* and 720*b*, wherein the fin includes the doped portion 705*b* and an undoped portion 725*b*.

The cross-sectional view shown in FIG. 8 illustrates LDMOS device 800*b*, which is an implementation of the LDMOS device 100*b*. The LDMOS device 800*b* has an in-situ EPI doped fin as source 805*a* (e.g., wherein source 805*a* can be one of a plurality of fins of source structure 135), drain 805*b* (e.g., wherein drain 805*b* can be one of a plurality of fins of drain structure 155), and pseudo-drain 805*c* (e.g., wherein pseudo-drain 805*c* can be one or a plurality of fins of pseudo-drain structure 104) of the device 800*b* and a gate 810 between the source 805*a* and pseudo-drain 805*c* on the first set of fins (e.g., combination of source 805*a* and pseudo drain 805*c*). The LDMOS device 800*b* also includes spacers 820*c* and 820*d* that surround the structures on the first set of fins (e.g., source 805*a* and pseudo-drain 805*c*) and spacers 820*a* and 820*b* that surround the second set of fins (e.g., drain 805*b*). A total height of the fins that are connected to Si substrate 835 is approximately 100-150 nanometers (nm) with approximately 30-50 nm exposed above a P-well 830 and N-well 840. In addition, the STIs (e.g., STI 808) of the LDMOS device 800*b* are shallower than in conventional LDMOS devices. For example, the STIs of the LDMOS device 800*b* are approximately 50-100 nm in length while the STIs of conventional LDMOS devices are approximately 200-250 nm in length.

In order to support high voltage applications, a breakdown voltage of the LDMOS device 800*b* has to provide a current path 806 from the drain 805*b* to the pseudo-drain 805*c* in portion 804 of the device 800*b* along a STI edge 802 that is long enough to reduce the voltage to a level that is supported by the pseudo-drain 805*c* and the gate 810. For example, a voltage at the drain 805*b* may be 3-5 volts or greater while a rated voltage for the pseudo-drain 805*c* may be 1.8V. The shorter length of the STIs STI 808) in the LDMOS device 800*b* along with the presence of the pseudo-drain 805*c* shortens current path from the drain 805*b* to the pseudo-drain 805*c*, which can make supporting high voltage applications more challenging because the voltage applied to the drain 805*c* is more difficult to deplete through a lightly doped drain (LDD) region. In addition, gate-induced drain leakage (GIDL) is also present. Also, compared to the implementations of the LDMOS device 100*a*, the current 806 stays further away from the STI edge defect-rich zone 802 but increasing the breakdown voltage becomes more difficult because of a reduced distance between current 806 flowing from the drain 805*b* to the pseudo-drain 805*c*. The LDMOS device 800*b* similarly includes an in-situ EPI doped fin 805*a* as the source, wherein the fin can include the doped portion 805*a* and an undoped portion 825*a*, and a drain structure 815 including in-situ EPI doped fin 805*b* as the drain surrounded by spacers 820*a* and 820*b*, wherein the fin includes the doped portion 805*b* and an undoped portion 825*b*.

The cross-sectional view shown in FIG. 9 illustrates LDMOS device 900*b*, which is an implementation of the LDMOS device 100*b*. The LDMOS device 900*b* has a similar structure to the LDMOS 800*b* (FIG. 8) having P-well 902 and an additional P-well 906 (wherein the additional P-well 906 can be an STI protection structure, for example) in contact with STI 908, which is inserted between N-wells 910 and 904. The LDMOS device 900*b* also includes a deep N-well 914 beneath N-wells 904 and 910 and the additional P-well 906. In an embodiment, the deep N-well 914 can also be extended beneath the P-well 902. The additional P-well 906 produces a reverse-biased P-N junction, which blocks current 912 from entering the additional P-well 906, which further draws the current 912 away from the STI edge 916 as well as the pseudo-drain 905*c*, which provides a longer current path between the drain 905*b* and the gate 910 and further to the source 905*a*, increasing the breakdown voltage of the LDMOS device 900*b*. Area 918 displays an example of covering part of the bottom of the pseudo-drain 905*c*. The LDMOS device 800*b* similarly includes in-situ EPI doped fin 905*a* as the source, wherein the fin can include the doped portion 905*a* and an undoped portion 925*a*, and a drain structure 915 including in-situ EPI doped fin 905*b* as the drain surrounded by spacers 920*a* and 920*b*, wherein the fin includes the doped portion 905*b* and an undoped portion 925*b*.

The cross-sectional view shown in FIG. 10 illustrates LDMOS device 1000*b*, which is an implementation of the LDMOS device 100*b*. The LDMOS device 1000*b* has a similar structure to the LDMOS 900*b* (FIG. 9) having P-well 1002 and additional P-well 1006 (wherein the additional P-well 1006 can be an STI protection structure, for example) in contact with STI 1008, which is inserted between N-wells 1010 and 1004. The LDMOS device 1000*b* also includes a deep N-well 1014 beneath at least N-wells 1004 and 1010, the additional P-well 1006, and an undoped region of Si substrate 1016. In one embodiment, the deep N-well 1014 can extend beneath P-well 1002. More specifically, the LDMOS device 1000*b* includes undoped region of Si substrate 1016 between a pulled-back P-well 1002 and a pulled-back N-well 1010. The undoped region 1016 further ensures that current 1012 flowing from the drain 1005*b* to the gate 1022 is long enough to support increased breakdown voltages (e.g., 5-6V). Additionally, area 1018 indicates that N-well 1010 can be reduced toward P-well 1006 and the undoped region of Si substrate 1016 can be added to increase the breakdown voltage as current 1012 travels from the drain 1005*b* to the pseudo drain 1005*c* and further to the source 1005*a*. The LDMOS device 1000*b* similarly includes in-situ EPI doped fin 1005*a* as the source, wherein the fin can include the doped portion 1005*a* and an undoped portion 1025*a*, and a drain structure 1015 including in-situ EPI doped fin 1005*b* as the drain surrounded by spacers 1020*a* and 1020*b*, wherein the fin includes the doped portion 1005*b* and an undoped portion 1025*b*.

Figure 11:
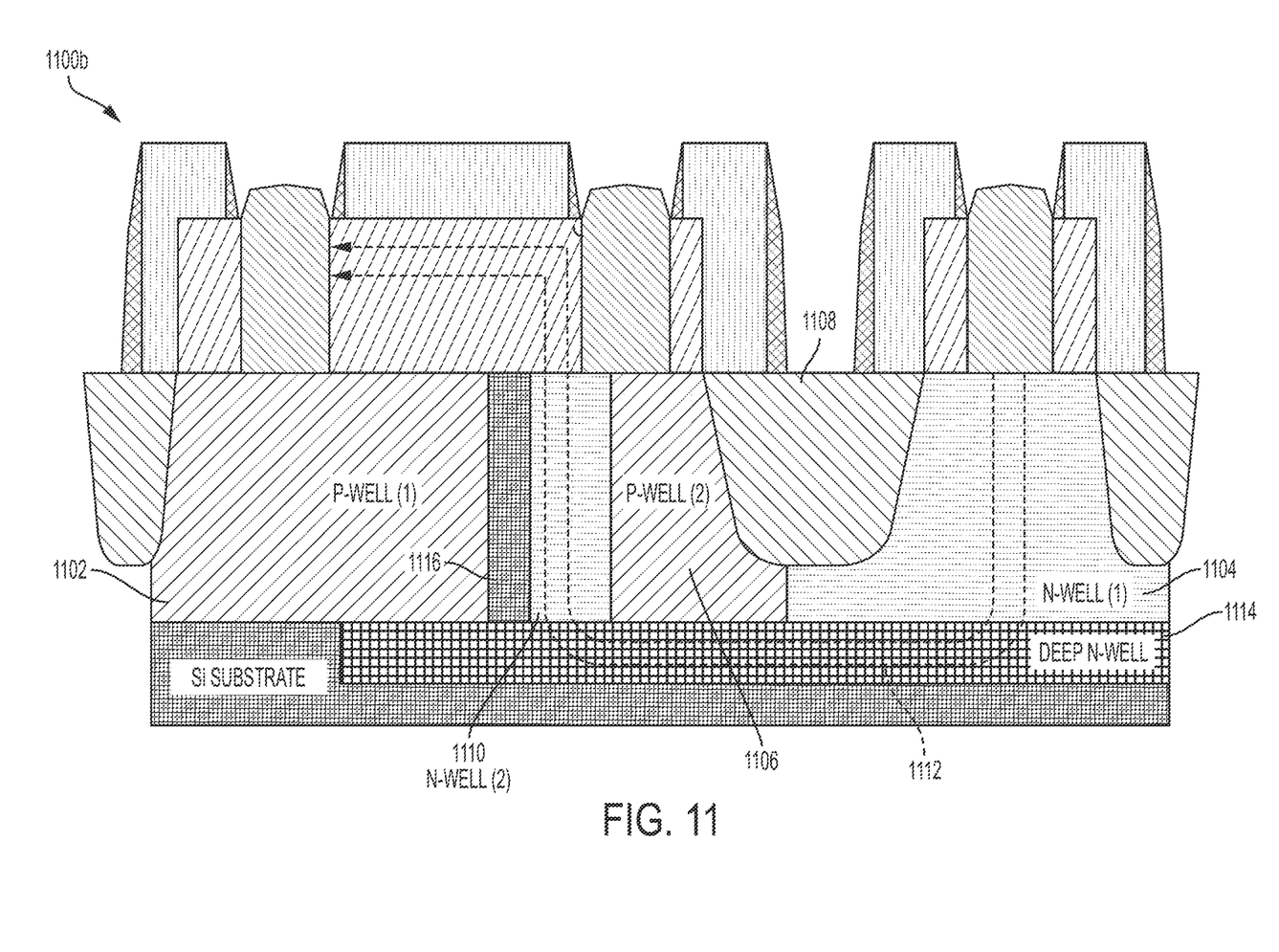
FIG. 11 illustrates a cross-sectional view of a second structure of a LDMOS fin FET device according to one or more aspects of the disclosed subject matter.

The cross-sectional view shown in FIG. 11 illustrates LDMOS device 1100*b* which is an implementation of the LDMOS device 100*b*. The LDMOS device 1100*b* has a similar structure to the LDMOS 1000*b* (FIG. 10) having P-well 1102 and additional P-well 1106 (wherein the additional P-well 1106 can be an STI protection structure, for example) in contact with STI 1108, which is inserted between N-wells 1110 and 1104. The LDMOS device 1100*b* also includes undoped region of Si substrate 1116 between a pulled-back P-well 1102 and a pulled-back N-well 1110. Additionally, the LDMOS device 1100*b* includes a deep N-well 1114 that extends under P-well 1102. In one embodiment, the deep N-well 1114 can be implemented in a multi-finger LDMOS device, for example.

In summary, advantages include improving the reliability of FinFET LDMOS devices by steering current away from the defect rich zones. Additionally, it can be understood that the implementations described herein with respect to N-type LDMOS devices can also be extended to P-type LDMOS devices. For P-type LDMOS structures, the raised source/drain EPI material is changed from N-type to P-type and the gate materials correspond to standard P-type gate materials. In addition, the P-wells are swapped with N-wells, and the N-wells are swapped with P-wells. The deep-N well remains present in the P-type LDMOS devices to provide isolations between the P-wells/N-wells and the Si substrate layer.

Those of skill in the art would appreciate that the various illustrative blocks, modules, elements, components, and methods described herein can be implemented as electronic hardware, computer software, or combinations of both. To illustrate this interchangeability of hardware and software, various illustrative blocks modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

Figure 12:
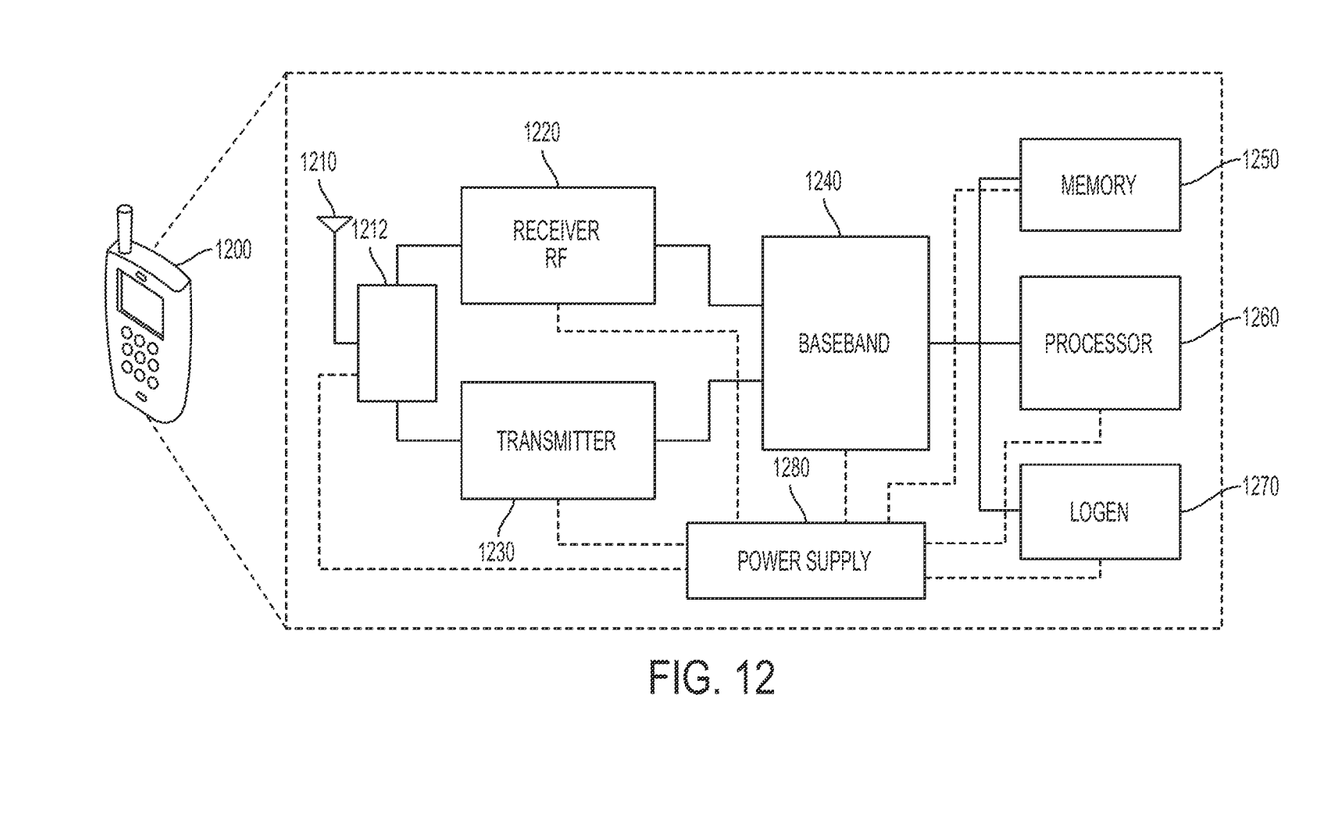
FIG. 12 illustrates an example of a wireless communication device according to one or more aspects of the disclosed subject matter.

FIG. 12 illustrates an example of a wireless communication device in accordance with one or more implementations. The wireless communication device 1200 includes a radio-frequency (RF) antenna 1210, a receiver 1220, a transmitter 1230, a baseband processing module 1240, a memory 1250, a processor 1260, a local oscillator generator (LOGEN) 1270, and a power supply 1280. In various embodiments of the subject technology, one or more of the blocks represented in FIG. 12 can be integrated on one or more semiconductor substrates. For example, the blocks 1220-1270 can be realized in a single chip or a single system on chip, or can be realized in a multi-chip chipset.

The RF antenna 1210 can be suitable for transmitting and/or receiving RF signals (e.g., wireless signals) over a wide range of frequencies. Although a single RF antenna 1210 is illustrated, the subject technology is not so limited.

The receiver 1220 includes suitable logic circuitry and/or code that can be configured to receive and process signals from the RF antenna 1210. The receiver 1220 may, for example, be configured to amplify and/or down-convert received wireless signals. In various embodiments of the subject technology, the receiver 1220 is configured to cancel noise in received signals and can be linear over a wide range of frequencies. In this manner, the receiver 1220 is suitable for receiving signals in accordance with a variety of wireless standards. Wi-Fi, WiMAX Bluetooth, and various cellular standards.

The transmitter 1230 includes suitable logic circuitry and/or code that can be configured to process and transmit signals from the RF antenna 1210. The transmitter 1230 may, for example, be configured to up-convert baseband signals to RF signals and amplify RF signals. In various embodiments of the subject technology, the transmitter 1230 is configured to up-convert and to amplify baseband signals processed in accordance with a variety of wireless standards. Examples of such standards include Wi-Fi, WiMAX, Bluetooth, and various cellular standards. In various embodiments of the subject technology, the transmitter 1230 is configured to provide signals for further amplification by one or more power amplifiers.

In some implementations, the transmitter 1230 includes an RF power amplifier that can be a high-voltage power amplifier fabricated using the LDMOS device (e.g. as shown in FIGS. 2-10) of the subject technology.

The duplexer 1212 provides isolation in the transmit band to avoid saturation of the receiver 1220 or damaging parts of the receiver 1220, and to relax one or more design requirements of the receiver 1220. Furthermore, the duplexer 1212 can attenuate the noise in the receive band. The duplexer is configured in multiple frequency bands of various wireless standards.

The baseband processing module 1240 includes suitable logic, circuitry, interfaces, and/or code that can be configured to perform processing of baseband signals. The baseband processing module 1240 may, for example, analyze received signals and generate control and/or feedback signals for configuring various components of the wireless communication device 1200 such as the receiver 1220. The baseband processing module 1240 is configured to encode, decode, transcode, modulate, demodulate, encrypt, decrypt, scramble, descramble, and/or otherwise process data in accordance with one or more wireless standards.

The processor 1260 includes suitable logic, circuitry, and/or code that can enable processing data and/or controlling operations of the wireless communication device 1200. In this regard, the processor 1260 is enabled to provide control signals to various other portions of the wireless communication device 1200. The processor 1260 can also control transfers of data between various portions of the wireless communication device 1200. Additionally, the processor 1260 can enable implementation of an operating system or otherwise execute code to manage operations of the wireless communication device 1200.

The memory 1250 includes suitable logic, circuitry, and/or code that can enable storage of various types of information such as received data, generated data, code, and/or configuration information. The local oscillator generator (LOGEN) 1270 includes suitable logic, circuitry, interfaces, and/or code that can be configured to generate one or more oscillating signals of one or more frequencies. The LOGEN 1270 can be configured to generate digital and/or analog signals. In this manner, the LOGEN 1270 can be configured to generate one or more clock signals and/or sinusoidal signals. Characteristics of the oscillating signals such as the frequency and duty cycle can be determined based on one or more control signals from, for example, the processor 1260 and/or the baseband processing module 1240.

In operation, the processor 1260 can configure the various components of the wireless communication device 1200 based on a wireless standard according to which it is desired to receive signals. Wireless signals can be received via the RF antenna 1210 and amplified and down-converted by the receiver 1220. The baseband processing module 1240 can perform noise estimation and/or noise cancellation, decoding, and/or demodulation of the baseband signals. In this manner, information in the received signal can be recovered and utilized appropriately. For example, the information can be audio and/or video to be presented to a user of the wireless communication device, data to be stored to the memory 1250, and/or information affecting and/or enabling operation of the wireless communication device 1200. The baseband processing module 1240 can modulate, encode and perform other processing on audio, video, and/or control signals to be transmitted by the transmitter 1230 in accordance to various wireless standards.

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more: Pronouns in the masculine (e.g., his) include the feminine and neuter gender (e.g., her and its) and vice versa. Headings and subheadings, if any, are used for convenience only and do not limit the subject disclosure.

The invention claimed is:

1. A finFET LDMOS semiconductor device, comprising:
   a first well disposed adjacent to a second well on a substrate;
   a third well disposed on the substrate, wherein the second well is disposed between the first well and the third well;
   a source disposed on the first well;
   a fin at least partially disposed on the first well and adjacent to the source;
   a drain disposed on the third well;
   a shallow trench isolation (STI) disposed at least partially in the third well; and
   a STI protection structure disposed on the substrate, the STI protection structure being further disposed between the second well and the third well and along a side wall of the STI that faces the second well, wherein the STI protection structure is configured to discourage a drain to source current from flowing along the side wall of the STI that faces the second well.

2. The finFET LDMOS semiconductor device of claim 1, wherein the first well comprises a P-doped material.

3. The finFET LDMOS semiconductor device of claim 2, wherein each of the second well and third well comprises an N-doped material.

4. The finFET LDMOS semiconductor device of claim 1, wherein the second well is positioned on a side of the STI closest to the source and the third well is positioned on an opposite side of the STI.

5. The finFET LDMOS semiconductor device of claim 1, wherein the STI protection structure is a same material as the substrate.

6. The finFET LDMOS semiconductor device of claim 1, wherein the STI protection structure comprises a P-doped material.

7. The finFET LDMOS semiconductor device of claim 1, wherein the substrate comprises a deep N-well and the second well and the third well being positioned on the deep N-well.

8. The finFET LDMOS semiconductor device of claim 7, wherein the substrate comprises the deep N-well, the second well, the third well and at least a portion of the first well being positioned on the deep N-well.

9. The finFET LDMOS semiconductor device of claim 1, wherein a total height of the fin is 100-150 nanometers.

10. The finFET LDMOS semiconductor device of claim 1, wherein a length of the STI is 50-100 nanometers.

11. A finFET LDMOS semiconductor device, comprising:
    a first well disposed adjacent to a second well on a substrate;
    a third well disposed on the substrate, wherein the second well is disposed between the first well and the third well;
    a source disposed on the first well;
    a fin at least partially disposed on the first well and adjacent to the source;
    a pseudo drain at least partially disposed on the second well;
    a drain disposed on the third well;
    a shallow trench isolation (STI) disposed at least partially in the third well; and
    a STI protection structure disposed on the substrate, the STI protection structure being further disposed between the second well and the third well and along a side wall of the STI that faces the second well, wherein the STI protection structure is configured to discourage a drain to source current from flowing along the side wall of the STI that faces the second well.

12. The finFET LDMOS semiconductor device of claim 11, wherein the first well comprises a P-doped material.

13. The finFET LDMOS semiconductor device of claim 12, each of the second well and third well comprises an N-doped material.

14. The finFET LDMOS semiconductor device of claim 11, wherein the second well is positioned on a side of the STI closest to the source and the third well is positioned on an opposite side of the STI.

15. The finFET LDMOS semiconductor device of claim 11, wherein the STI protection structure comprises a P-doped material.

16. The finFET LDMOS semiconductor device of claim 11, wherein the substrate comprises a deep N-well and the second well and the third well being positioned on the deep N-well.

17. The finFET LDMOS semiconductor device of claim 16, wherein the substrate comprises the deep N-well, the second well and the third well and at least a portion of the first well being positioned on the deep N-well.

18. The finFET LDMOS semiconductor device of claim 11, wherein a total height of the fin is 100-150 nanometers.

19. The finFET LDMOS semiconductor device of claim 11, wherein a length of the STI is 50-100 nanometers.

* * * * *